United States Patent [19]

Hidaka et al.

[11] Patent Number: 4,540,603
[45] Date of Patent: Sep. 10, 1985

[54] RESIN-MOLDED SEMICONDUCTOR DEVICE AND A PROCESS FOR MANUFACTURING THE SAME

[75] Inventors: Toshiyuki Hidaka; Hisashi Sakamoto; Toshiaki Fukuhara, all of Hitachi; Sadao Fujieda, Haramachi; Yutaka Misawa, Katsuta, all of Japan

[73] Assignee: Hitachi, Ltd., Tokyo, Japan

[21] Appl. No.: 563,039

[22] Filed: Dec. 19, 1983

[30] Foreign Application Priority Data

Dec. 20, 1982 [JP] Japan .................. 57-224483

[51] Int. Cl.³ ........................................... H01L 23/30
[52] U.S. Cl. ............................. 427/82; 427/240
[58] Field of Search ........................... 427/240, 82

[56] References Cited

U.S. PATENT DOCUMENTS

| 3,492,157 | 1/1970 | Ito et al. | 427/82 |
| 3,958,039 | 5/1976 | Yabuki | 427/82 |
| 4,282,136 | 8/1981 | Hunt | 427/82 |

FOREIGN PATENT DOCUMENTS 55-1174   1/1980   Japan .
202508   11/1967   U.S.S.R. .................. 427/240

*Primary Examiner*—John D. Smith
*Attorney, Agent, or Firm*—Antonelli, Terry & Wands

[57] ABSTRACT

A process for manufacturing resin-molded semiconductor devices which are sealed in an epoxy resin is carried out without employing a metal mold. In the process, an epoxy resin is deposited on a sub-assembly consisting of a semiconductor pellet brazed to axial leads while turning the sub-assembly with the axial leads as a center so that the epoxy resin is applied to a predetermined shape; then the epoxy resin is heated at an elevated temperature while turning the sub-assembly so that surface portions of the epoxy resin are hardened and the epoxy resin is further heated at an elevated temperature without turning the sub-assembly so that the epoxy resin is completely hardened.

4 Claims, 4 Drawing Figures

RESIN-MOLDED SEMICONDUCTOR DEVICE AND A PROCESS FOR MANUFACTURING THE SAME

BACKGROUND OF THE INVENTION

The present invention relates to a resin-molded semiconductor device, and more specifically to a resin-molded axial lead-type semiconductor device.

Semiconductor devices have been extensively used which are obtained by sealing in an epoxy resin a sub-assembly in which a semiconductor pellet is held by brazing between a pair of axial leads. So far, however, the sub-assembly is sealed in the epoxy resin by using a metal mold. When a glass is to be used for the purpose of sealing, a slurry of glass is applied round a semiconductor pellet in the sub-assembly and is then baked. In this case, there is no need of employing the metal mold. When the epoxy resin is used, however, the metal mold must be employed unlike the case of using the glass. The reason for requiring the metal mold is because there is no one-can-type epoxy resin available which cures to some extent within a few minutes. Namely, the resin initially is transformed into a sol just before the resin cures, and its viscosity decreases strikingly relative to its viscosity at ordinary temperature. Accordingly, the resin separates from the sub-assembly.

Japanese Patent Laid-Open No. 1174/1980 discloses a method according to which the sub-assembly is sealed in a glass, and the epoxy resin is further applied thereto. In this case, however, the applied epoxy resin forms a film which is not thick enough to achieve the desired sealing.

According to a sealing method which is now practiced by using an epoxy resin, it is necessary to employ a metal mold. Therefore, cumbersome operation is required for setting the sub-assembly within the metal mold, for injecting the epoxy resin therein, for parting the sub-assembly from the metal mold, and the like. In particular, it is difficult to continuously perform the setting and parting operations, thereby imposing a bottleneck for mass-production. When a parting agent is contained in the epoxy resin to facilitate the parting operation, the adhesiveness between the resin and the leads is reduced, and gaps are often formed between the leads and the sealing layer in the semiconductor device. Water infiltrates through the gaps and reaches the semiconductor pellet; i.e., the semiconductor device loses desired characteristics and further loses reliability in operation.

SUMMARY OF THE INVENTION

The object of the present invention is to provide a resin-molded semiconductor device sealed in an epoxy resin which has high quality and reliability.

Another object of the present invention is to provide a process for manufacturing resin-molded semiconductor devices which are sealed in the epoxy resin without employing a metal mold.

The present invention relates to a process which comprises:

a step of horizontally holding a sub-assembly that consists of a semiconductor pellet brazed to axial leads, and of depositing an epoxy resin of a predetermined amount onto the semiconductor pellet while turning the sub-assembly with the axial leads as a center, so that the epoxy resin is applied to a predetermined shape;

a step of heating the epoxy resin at a temperature of 160° to 180° for a period of 2 to 10 minutes while turning the sub-assembly, so that surface portions of the epoxy resin are hardened; and a step of heating the epoxy resin at a temperature of 160° to 200° C. for a period of 3 to 24 hours without turning the sub-assembly, so that the epoxy resin is completely hardened.

The invention also relates to a semiconductor device which is obtained by the above-mentioned process. The invention can be put into practice by using an epoxy resin which has a suitable hardening property and a suitable thixotropic index.

DETAILED DESCRIPTION OF THE INVENTION

Figure 1:
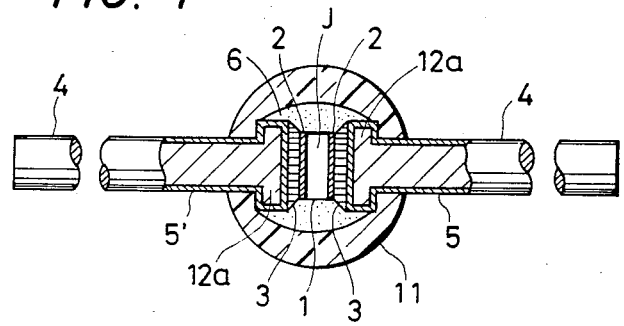
FIG. 1 is a vertical section view of a resin-molded semiconductor device according to an embodiment of the present invention.

FIG. 1 is a vertical section view of a resin-molded semiconductor device according to the present invention. In FIG. 1, a silicon pellet 1 having a pn junction J has nickel-plated layers 2 on both of its surfaces so that soldering can be easily accomplished. The silicon pellet 1 is held between a pair of copper header leads 4 by soldering as designated by reference numeral 3. Silver-plated layers 5 are formed on the surfaces of the header leads 4. To stabilize the surfaces of pn junction J of the silicon pellet 1 of the thus constructed sub-assembly, a conventional surface-stabilizing material 6 such as silicone resin is provided around the side periphery of the silicon pellet 1, and then a sealing layer is formed by using an epoxy resin.

Specifically, in the embodiments of the invention there is used a one-can epoxy resin which has epoxy groups in the molecules thereof, and which contains 3 to 15 moles of an organic dibasic acid dihydrazide per 100 moles of the epoxy resin, and 2 to 7 moles of an imidazole compound represented by the following formula;

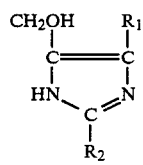

wherein
- $R_1$ is a methyl group, a hydrogen atom or a hydroxymethyl group, and
- $R_2$ is an alkyl group, per 100 moles of the epoxy resin.

It is also allowable to use a one-can epoxy resin which does not contain the organic dibasic acid dihydrazide, but which contains only the imidazole compound represented by the above formula in an amount of 2 to 20 moles per 100 moles of the epoxy resin.

This resin exhibits a thixotropic index and hardening property that are suited for effecting the manufacturing process that will be described below. This resin exhibits a viscosity ratio of 1.0 to 2.5 as measured by a rotation viscometer under the conditions of 4 turns a minute and 20 turns a minute, and exhibits a gellation time of 0.8 to 3 minutes in a constant temperature bath.

By using this resin, the device of the embodiment of FIG. 1 is manufactured as described below.

First, the epoxy resin of a predetermined amount is dropped onto the sub-assembly which is contained in the surface-stabilizing material 6 and which is rotated at a speed of 2 turns a second with the electrodes 4 being held nearly horizontally. The resin will be required in an amount of about 0.05 grams when it is to be applied to a length of 4 mm and to a diameter of 3.5 mm onto the sub-assembly in which the leads have a diameter of 0.6 mm and the header portions 12a have a diameter of 1.5 mm. As the sub-assembly rotates, the epoxy resin builds up in a shape as shown. That is, in the portions where the epoxy resin comes into contact with the electrodes 4 or the surface-stabilizing material 6, the resin transforms into a sol due to the frictional force produced by the rotation, whereby the viscosity decreases and the resin is applied well onto the header leads 4 and the surface-stabilizing material 6. In the portions remote from the sub-assembly, on the other hand, the frictional force decreases and the centrifugal force only acts. Therefore, the epoxy resin is not transformed into sol, and maintains the shape as shown. Then, the surface only of the epoxy resin is hardening by heating while rotating the sub-assembly. Good results will be obtained if the epoxy resin is heated at 160° to 180° C. for 2 to 10 minutes. In this case, the epoxy resin in the surface is once solated by the heat and its viscosity decreases conspicuously. However, the internal epoxy resin is not solated and has a viscosity which is greater than that of the epoxy resin in the surface. Therefore, the illustrated shape is roughly maintained, and the surface portion only is hardened. The internal epoxy resin is confined by the surface portion which is hardened. At this moment, therefore, the epoxy resin does not fall from the sub-assembly although it is not rotated; i.e., the epoxy resin which is applied thereto maintains its shape. Therefore, there is no need of rotating the sub-assembly. That is, rotation of the sub-assembly is stopped, and the epoxy resin is heated at 160° to 200° for 3 to 24 hours so that it is perfectly cured up to its internal portion, at a different place as required. In the above-mentioned embodiment, the epoxy resin is hardened by heating. The epoxy resin, however, can also be hardened by the conventional methods such as irradiation with ultraviolet rays, X-rays, infrared rays, and electron beam.

According to this process as described above, the sub-assembly can be molded without the need of using the metal mold. Therefore, the number of manufacturing steps can be reduced, and the manufacturing operation can be continuously carried out using an automatic machine to mass-produce devices maintaining stable quality.

The epoxy resin is hardened after it is sufficiently applied to the header leads 4 or the surface-stabilizing material 6. Therefore, the sealing layer 11 is well adhered onto the header leads 4 or the surface-stabilizing material 6. Further, since the epoxy resin does not contain a parting agent, no gap develops that occurred in the conventional procedure between the leads and the sealing layer, and there is obtained a semiconductor device having an increased resistance against moisture.

Figure 2:
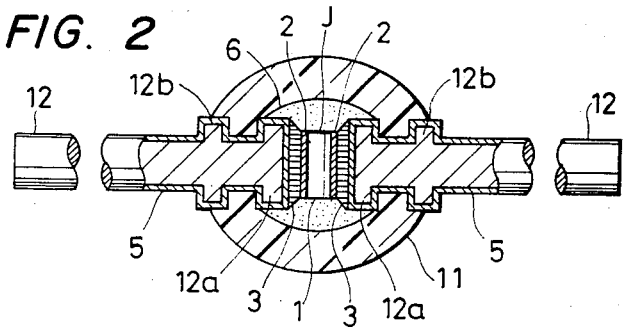
FIG. 2 is a vertical section view of a resin-molded semiconductor device according to another embodiment of the present invention.

FIG. 2 illustrates another embodiment of the present invention, in which the portions same as, or corresponding to, those of FIG. 1 are denoted by the same reference numerals.

This embodiment employs double header leads 12 which have flange portions 12b at positions separated from the header portions 12a.

The flange portions 12b block the epoxy resin from flowing in the axial direction when it is being applied, work to trim the shape of the sealing layer 11, and contribute to stabilizing the quality.

Figure 3:
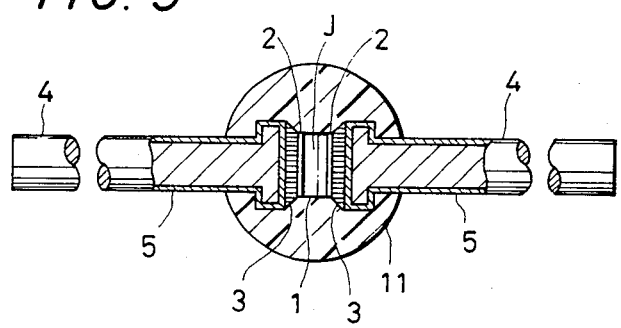
FIG. 3 is a vertical section view of a resin-molded semiconductor device according to a further embodiment of the present invention.

FIG. 3 shows a further embodiment of the present invention, in which the portions same as, or corresponding to, those of FIG. 1 are denoted by the same reference numerals.

In this embodiment, the surface-stabilizing material is not used that was employed in the embodiment of FIG. 1, and the sub-assembly is directly wrapped in the sealing layer 11 composed of the epoxy resin.

The above-mentioned epoxy resin does not contain mobile ions such as $Na^+$, $Cl^-$, or the like, that make the exposed surfaces of pn junction J of the silicon pellet 1 unstable. Therefore, use of the surface-stabilizing material can be eliminated so far as the epoxy resin is not contaminated by mobile ions such as $Na^+$, $Cl^-$, or the like. This helps further reduce the number of manufacturing steps.

Figure 4:
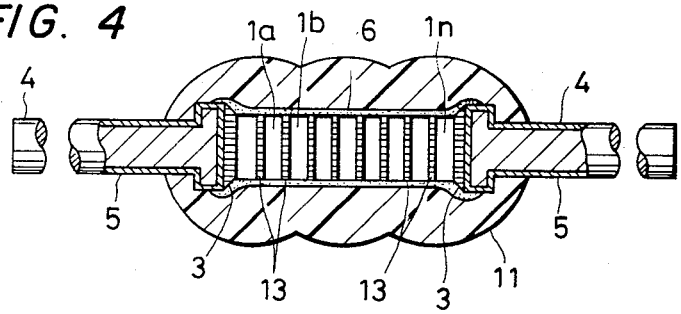
FIG. 4 is a vertical section view of a resin-molded semiconductor device according to yet further embodiment of the present invention.

FIG. 4 shows still further embodiment of the present invention, in which the portions same as, or corresponding to, those of FIG. 1 are denoted by the same reference numerals.

In this embodiment, a plurality of silicon pellets $1a$, $1b$, . . . , $1n$ having pn junctions (not shown) are laminated in a predetermined rectifying direction, adhered by brazing as designated at 13, and are then supported between the header leads 4 by brazing as designated at 3. Here, the brazing material 3 has a melting point lower than that of the brazing material 13, such that the laminate of silicon pellets $1a$, $1b$, . . . , $1n$ is not deformed when it is being brazed to the header leads 4 with brazing material 3. FIG. 4 does not show nickel-plated layers formed on the silicon pellets $1a$, $1b$, . . . , $1n$.

There will be obtained a withstand voltage which increases in proportion to the number of silicon pellets $1a$, $1b$, . . . , $1n$.

According to the process of the present invention, a sub-assembly can be molded sufficiently even if there is a large distance between the two header leads 4.

According to the present invention as described above, it is possible to obtain a resin-molded semiconductor device which can be easily molded in a continuous manner, which is suited for being mass-produced, and which maintains high quality and reliability.

What is claimed is:

1. A process for manufacturing semiconductor devices comprising:

a step of horizontally holding a sub-assembly that consists of a semiconductor pellet brazed to a pair of axial leads, and of depositing an epoxy resin of a predetermined amount onto the semiconductor pellet while turning the sub-assembly with the axial leads as a center;

a step of heating the epoxy resin at a temperature of 160° to 180° C. for a period of 2 to 10 minutes while turning the sub-assembly, so that surface portions of the epoxy resin are hardened; and a step of heating the epoxy resin at a temperature of 160° to 200° C. for a period of 3 to 25 hours while maintaining the sub-assembly stationary without turning it, so that the epoxy resin is completely hardened.

2. A process for manufacturing semiconductor devices according to claim 1, wherein the epoxy resin which is to be deposited has a thixotropic index of 1.0 to 2.5, and a gelation time of 0.8 to 3 minutes.

3. A process for manufacturing semiconductor devices according to claim 2, wherein the epoxy resin which is deposited is a one-can epoxy resin which has epoxy groups in the molecules, and which contains 3 to 15 moles of an organic dibasic acid dihydrazide per 100 moles of the epoxy resin, and 2 to 7 moles of an imidazole compound represented by the following formula;

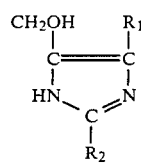

wherein
$R_1$ is a methyl group, a hydrogen atom or a hydroxymethyl group, and
$R_2$ is an alkyl group, per 100 moles of the epoxy resin.

4. A process for manufacturing semiconductor devices according to claim 2, wherein the epoxy resin which is deposited is a one-can epoxy resin which has epoxy groups in the molecules, and which contains 2 to 20 moles of the imidazole compound represented by the following formula;

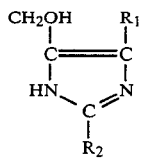

wherein
$R_1$ is a methyl group, a hydrogen atom or a hydroxymethyl group, and
$R_2$ is an alkyl group, per 100 moles of the epoxy resin.

* * * * *